United States Patent [19]

Sullivan et al.

[11] Patent Number: 4,523,370

[45] Date of Patent: Jun. 18, 1985

[54] PROCESS FOR FABRICATING A BIPOLAR TRANSISTOR WITH A THIN BASE AND AN ABRUPT BASE-COLLECTOR JUNCTION

[75] Inventors: Paul A. Sullivan; George J. Collins, both of Fort Collins, Colo.

[73] Assignee: NCR Corporation, Dayton, Ohio

[21] Appl. No.: 558,252

[22] Filed: Dec. 5, 1983

[51] Int. Cl.³ .......................................... H01L 21/322
[52] U.S. Cl. ..................................... 29/576 B; 29/571; 29/576 E; 148/1.5; 148/175; 148/DIG. 92; 148/DIG. 11
[58] Field of Search ................. 29/571, 576 E, 576 B; 148/1.5, 175; 219/121 L; 357/34, 59

[56] References Cited

U.S. PATENT DOCUMENTS

| | | | |
|---|---|---|---|
| 4,252,581 | 2/1981 | Anantha et al. | 357/59 |
| 4,269,631 | 5/1981 | Anantha et al. | 148/1.5 |
| 4,270,960 | 6/1981 | Bollen et al. | 148/175 |
| 4,272,880 | 6/1981 | Pashley | 29/571 |
| 4,357,622 | 11/1982 | Magdo et al. | 148/1.5 |
| 4,437,897 | 3/1984 | Kemlage | 148/1.5 |
| 4,451,844 | 5/1984 | Komatsu et al. | 357/34 |
| 4,452,645 | 6/1984 | Chu et al. | 357/59 |

OTHER PUBLICATIONS

Swartz et al., "An Uncompensated Silicon Bipolar Junction Transistor Fabricated Using Molecular Beam Epitaxy", IEEE Electron Device Letters, vol. EDL-2, No. 11, 11/1981.
Graul et al., "High-Performance Transistors with Arsenic-Implanted Polysil Emitters", IEEE Journal of Solid State Circuits, vol. SC-11, No. 4, Aug. 1976.
Ning et al., "Effect of Emitter Contact on Current Gain of Silicon Bipolar Devices", IEEE Transactions on Electron Devices, vol. ED-27, No. 11, Nov. 1980.
Xiangliu, "A New Type of Device Structure for Bipolar Logic IC's with Polysilicon Emitter Regions (PER)", Electronic Science and Technology (Chinese), p. 7, No. 7, 1980.
Xiangliu et al., "The Activation Effect of CW Laser Irradiation on Bipolar Transistors with Polysilicon Emitter Regions", Extended Abstracts, vol. 81-2, p. 1004, The Electrochemical Society, Fall Meeting, Denver, Colorado, 1981.
Gat, "Heat-Pulse Annealing of Arsenic-Implanted Silicon with a CW Arc Lamp", IEEE Electron Device Letters, vol. EDL-2, No. 4, Apr. 1981.
Lietoila et al., "The Rate of CW Laser Induced Solid Phase Epitaxial Regrowth of Amorphous", Appl. Phys. Lett. 39(10), Nov. 15, 1981.
Bean et al., "Laser Induced Epitaxy of Amorphous Deposited Silicon", AIP Conference Proceedings, 1978.
Weeks et al., "Laser Epitaxy Over Buried Layers", Materials Research Society Symposia Proceedings, 1981.
Petersen, "Ultra Thin Base, Beam-Crystallized Bipolar", IBM Tech. Discl. Bull. vol. 22, No. 11, Apr. 1980.
Nakata et al., "Novel Low-Temperature Recrystallization of a-Si by High Energy Ion Beam", Appl. Phys. Lett. vol. 40, No. 8, Apr. 1982.
Hendel et al., "Laser Annealing of Bipolar NPN Transistors", J. Vac. Sci. Tech. 18(3) Apr. 1981.
Shappir et al., "Polycrystalline Silicon Recrystallization by Combined CW Laser and Furnace Heating", J. Electrochemical Soc. vol. 131, No. 4, Apr. 1984.

Primary Examiner—Brian E. Hearn
Assistant Examiner—Hunter L. Auyang
Attorney, Agent, or Firm—J. T. Cavender; Casimer K. Salys

[57] ABSTRACT

A process for fabricating a bipolar transistor with a thin base and an abrupt base-collector junction includes the steps of depositing a thin layer of polycrystalline or amorphous silicon base material in a single crystal collector region, while in-situ doping the deposited silicon with boron atoms, and thereafter, recrystallizing the deposited silicon layer by thermal-pulse annealing at a temperature high enough to effect recrystallization and solid phase epitaxial regrowth while low enough to minimize interdiffusion of dopants between the base and collector.

The process further includes providing the transistor fabricated by the aforedescribed steps with an abrupt base-emitter junction. This is accomplished by depositing n++ doped polysilicon with a LPCVD process and thereafter thermal annealing the polysilicon.

8 Claims, 6 Drawing Figures

PROCESS FOR FABRICATING A BIPOLAR TRANSISTOR WITH A THIN BASE AND AN ABRUPT BASE-COLLECTOR JUNCTION

BACKGROUND OF THE INVENTION

1. Field of the Invention

The instant invention relates to a process for fabricating a bipolar junction transistor utilizing polysilicon base and emitter regions. More particularly, the instant invention relates to a process for fabricating a bipolar junction transistor having a base region of narrow width, an abrupt base-collector junction and, preferably, an abrupt base-emitter junction, also.

2. Technical Considerations and Prior Art

Bipolar junction transistors are well known semiconductor devices which are widely used, e.g., as high-speed switches in integrated logic circuits and for processing microwave signals. The term "bipolar" is utilized because charge carriers of both positive and negative polarities participate in the operation of the transistors. Typically, a bipolar transistor includes a collector region, a base region and an emitter region. In accordance with the type of bipolar transistor under consideration in this application, the collector and emitter regions are made of n-type semiconductor material, while the base region is made of p-type semiconductor material. Generally the base region is formed by doping silicon with boron and diffusing the boron through the base region while the collector and emitter regions are doped with arsenic or phosphorus which are diffused therethrough. The regions are stacked upon one another with the base region disposed between the collector and emitter to form what is generally referred to as a npn transistor. By applying a positive potential to the base with respect to the emitter, the collector current can be switched on. By controlling the dimensions and other parameters of the regions, the collector current can exceed the base current by an order of magnitude or two which increase is known as "gain".

In order to achieve high switching speeds and gain, it is important to have a "narrow" or thin base so as to reduce the transit time for an electron injected by the emitter to pass through the base and so that virtually all the electrons injected by the emitter are transported across the base to the collector.

In order to minimize the base width, a great deal of effort has been expended to control doping concentrations and diffusing processes. In recent years, this control has been effected by various ion-implantation processes and by computer-controlled diffusion furnaces.

As a general practice, the boron-doped base region of an npn bipolar transistor is obtained by diffusion and must be annealed to relieve the implant damage and to activate the acceptors. This results in diffusion profile characteristics which make it difficult to maintain an abrupt base-collector junction and a well-defined, and controlled, base thickness. Thermal annealing is still necessary when the boron atoms have been implanted by ion implantation.

In accordance with one approach for producing very narrow base width, ultra-high-speed bipolar transistors, molecular beam epitaxy is utilized wherein a base region formed of boron-doped polysilicon is grown without utilizing diffusion steps. Such an approach is disclosed in the article "An Uncompensated Silicon Bipolar Junction Transistor Fabricating Using Molecular Beam Epitaxy" by Swartz et al., which appears in the *IEEE Electron Device Letters,* Vol. EDL-2, No. 11, November 1981. However, this process is done at 850° C. which can cause diffusion at junctions, thus reducing switching speed and gain. Moreover, this appears to be a time-consuming operation, and the equipment for performing molecular beam epitaxy is very expensive.

With the current technology, it is preferable to utilize standard polysilicon deposition techniques, since the facilities for polysilicon deposition are widely available in the industry.

The prior art includes a number of publications disclosing techniques for enhancing transistors fabricated by depositing polysilicon. Articles by Graul et al., "High Performance Transistors with Arsenic-Implanted Polysil Emitters", *IEEE Journal of Solid State Circuits,* SC-11, p. 491, August 1976 and Ning et al., "Effect of Emitter Contact on Current Gain of Silicon Bipolar Devices", *IEEE Trans. Electron Devices.* Vol. ED-27, pp. 2051–2055, 1980, both consider processes to improve the emitter region of a bipolar junction transistor by depositing polysilicon into the emitter contact and then implanting the polysilicon with arsenic. This technique provides improved gain, higher breakdown voltage and lower base-emitter junction capacitance. The structure disclosed in these articles is advantageous because there is less base-doping impurity in the emitter than in the conventional double-diffused process. Moreover, the base-emitter junction is very abrupt, and the emitter can be very small.

Similar bipolar devices have been reported by Sullivan et al., "High Performance Bipolar Transistors in a CMOS Process", *IEEE Trans. on Electron Devices.* ED-29, pp. 1679–80, October 1982.

In addition, there is another Ning et al. publication, "Self-Aligned Bipolar Transistors for High Performance and Low-Power-Delay VLSI", *IEEE Trans. Electron Devices,* Vol. ED-28, Page 1010–1013, 1981, which describes a bipolar junction transistor wherein an arsenic-implanted polysilicon emitter is used as described in the two previously mentioned articles, with the addition that boron-doped polysilicon is provided as a diffusion source to fabricate a self-aligned p+ extrinsic base region around the lightly boron-doped, single-crystal silicon intrinsic base region which is directly under the emitter.

Jiang et al., "The Activation Effect of CW Laser Irradiation on Bipolar Transistors with Polysilicon Emitter Regions", Extended Abstracts, Vol. 81-2, Page 1004, The Electrochemical Society, Fall Meeting, Denver, Colo., 1980, and Jiang, "A New Type of Bipolar Logic IC with Polysilicon Emitter Region", *Electronic Science and Technology* (Chinese), Page 7, Number 7, 1980, describe a technique for making a polysilicon emitter region bipolar transistor where doped polysilicon is deposited at low temperatures so that a very abrupt base-emitter junction is formed with no inter-diffusion. In an emitter, it is advantageous to have the highest possible doping of electrically-active donors. Phosphorus is better than arsenic in this respect, because generally a higher active donor concentration can be achieved with phosphorus since arsenic tends to cluster. However, in recent years, most bipolar junction transistor processes have shifted to arsenic-doped emitters because more abrupt junctions can be formed since the diffusion coefficient of arsenic is much lower than the diffusion coefficient of phosphorus. The in-situ phosphorus-doped polysilicon emitter described by Jiang et al., has the best of both, because the phosphorus-doped polysilicon can be deposited at low temperature to form an abrupt junction. The laser irradiation used by Jiang et al. activates the phosphorus donors but is sufficiently brief that no diffusion occurs. In-situ doping of the polysilicon during low temperature deposition produces a more abrupt junction than ion implantation since there is a "tail" in the concentration of phosphorus versus depth when it is implanted into silicon.

Gat et al., "CW Laser Anneal of Polycrystalline and Silicon; Crystalline Structure, Electrical Properties", *Applied Physics Letters,* Vol. 33, Page 775, 1978, and "CW Laser Annealing of Ion Implanted Single Crystal Silicon", PhD Thesis, Chapter 3, Page 52–88, Stanford University, October, 1979, disclose work on laser annealing of polysilicon directed toward growth of large, single-crystal grains and epitaxial regrowth of polycrystalline silicon from a single crystal seed. Since the polysilicon emitter in a polysilicon emitter region transistor is deposited directly on a single-crystal base region, it is quite possible that a carefully controlled thermal pulse anneal will result in epitaxial crystallization of the emitter so that it becomes single crystal silicon. Epitaxial crystallization of the emitter may, however, be undesirable since the higher gain exhibited by polysilicon emitter transistors apparently is due to a low hole recombination lifetime in the emitter due to the presence of the grain boundaries in the polysilicon.

U.S. Pat. Nos. 4,272,880; 4,270,960; and 4,269,631 disclose processes for enhancing transistors utilizing polysilicon layers. However, none of these patents, nor the aforementioned articles, fully develop the possibilities for achieving higher switching speeds and gain for bipolar junction transistors by utilizing a recrystallized polysilicon layer for the base region.

SUMMARY OF THE INVENTION

It is a feature of the instant invention to provide a process for fabricating bipolar junction transistors with a thin base and an abrupt base-collector junction as well as an abrupt emitter-base junction.

In accordance with this feature and other features, the instant invention contemplates methods of treating polysilicon deposited on previously-fabricated single crystal material wherein the polysilicon is in-situ doped with impurities and thereafter recrystallized by thermal-pulse annealing. The thermal-pulse annealing is performed in a vacuum at a temperature high enough to effect recrystallization and solid phase epitaxy but low enough to avoid migration of dopants from the polysilicon into the previously-fabricated material so as to maintain the abrupt junction with the previously-fabricated material that existed subsequent to the deposition of polysilicon.

Preferably, the temperature at which recrystallization and solid phase epitaxy is effected is within the range of approximately 600° C.–650° C. The aforedescribed steps are particularly suitable for converting a thin layer of polysilicon into a base region having an abrupt junction with the collector region.

The invention further contemplates depositing the polysilicon to a thickness of 0.02 micrometer (um) to 0.5 um and in-situ doping the polysilicon with boron to a concentration of approximately $10^{16}$ to $10^{19}$ boron atoms per cubic centimeter of polysilicon, while maintaining a deposition temperature in the range of approximately 600° C. to 650° C., to thereby initially form a thin base layer with an abrupt base-collector junction.

The instant invention further contemplates performing the aforecited steps in combination with subsequently forming emitter and collector contact regions from a layer of n+ polysilicon which is thermal pulse annealed, to maintain an abrupt base-emitter junction and to anneal a previously implanted p+ base contact region.

BRIEF DESCRIPTION OF THE DRAWINGS

The invention, together with its various features and advantages, can be easily understood from the following more detailed description taken in conjunction with the accompanying drawings, in which.

DESCRIPTION OF THE PREFERRED EMBODIMENT

Figure 1:
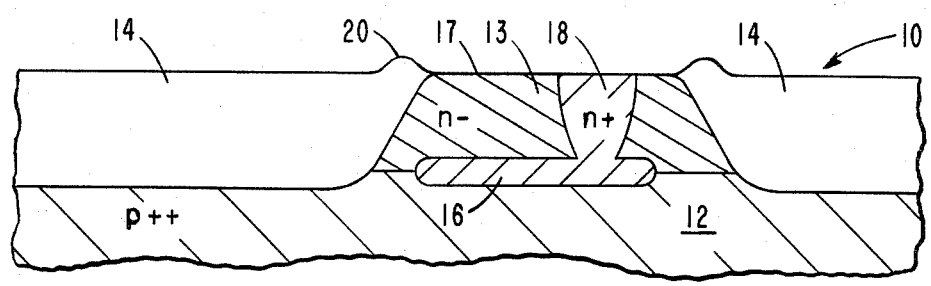
FIG. 1 is a diagrammatic, cross-sectional elevation of a bipolar junction transistor substructure, prior to fabrication of the base region.

Referring now to FIG. 1, there is shown a typical transistor substructure, designated generally by the numeral 10, which is ready to receive deposition of a base region 11 (see FIGS. 2–6). The substructure 10 includes a heavily doped p++ silicon substrate 12 upon which a lightly doped, n− epitaxial, single crystal collector 13 has been formed. The collector 13 is surrounded by an isolation oxide 14. Optionally, the collector 13 may have an n+ subcollector 16 which is accessed from the surface 17 of the collector, via an n+ contact which is formed by sinker diffusion 18. The isolation oxide 14 shown in FIG. 1 is preferably formed by a conventional recessed LOCOS process.

Figure 2:
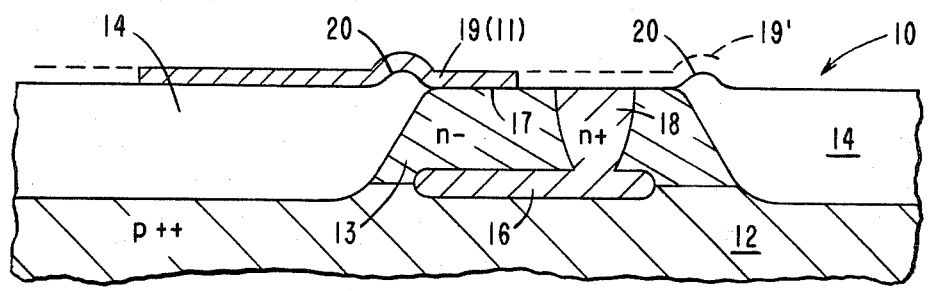
FIG. 2 illustrates the transistor structure of FIG. 1 after a boron-doped polysilicon layer has been deposited thereon.

Referring now to FIG. 2, the substructure 10 receives a layer of polysilicon 19 on the surface 17, which layer of polysilicon 19 overlaps the entire substrate. The polysilicon layer 19 is subsequently processed to form the base 11. The silicon layer 19 can either be polycrystalline or amorphous.

In accordance with the instant invention, the polysilicon layer 19 is deposited in a thin layer having a thickness in the range of 0.02 to 0.5 um by using low pressure chemical vapor deposition (LPCVD). While the polysilicon layer 19 is being deposited, it is in-situ doped with boron atoms to a concentration of approximately $10^{16}$ to $10^{19}$ boron atoms per cubic centimeter of polysilicon. As has been previously emphasized in this application, it is important to keep the polysilicon layer 19 thin because the transit time for injected electrons through the subsequently-formed base 11 needs to be kept short in order to provide a fast switching speed for the transistor. By using a LPCVD process, layers as thin as 0.01 um may be deposited and uniformity of ±0.005 um may be maintained across large silicon wafers.

In addition, LPCVD processes are ideal for forming very thin layers of p-type silicon on n-type substrates. Moreover, LPCVD deposition of polycrystalline silicon can be done at temperatures of about 620° C. to 700° C., while deposition of amorphous silicon can be done at temperatures below 600° C. Accordingly, a very abrupt pn base-collector junction is formed with minimal inter-diffusion of impurities when depositing either amorphous or polycrystalline silicon since diffusion at these temperatures is negligible.

The polysilicon 19 is then photomasked (not shown) and etched to remove the dotted line portion 19' so as to expose the n+ contact 18. The photoresist is then stripped to reexpose the polysilicon layer 19. In order to be suitable for the base region 11 of a transistor, the polysilicon layer 19 must be "regrown" as a single crystal by epitaxial recrystallization.

This regrowth of the polysilicon layer 19 utilizes the single crystal, epitaxial n− region 13 as a "seed". It is performed in a vacuum or inert ambient by thermal pulse annealing. By limiting the thermal pulse heating step to less than 1200° C. for less than 10 seconds, inter-diffusion of dopants across the surface 17 from either the collector material or base material is negligible and the abrupt junction between the collector 13 and base 11 is maintained. By using thermal pulse annealing, the energy sufficient to recrystallize the polysilicon layer 19 may be imparted to the polysilicon layer in less than one second of exposure time, although 5 to 10 seconds is typical. Thermal-pulse recrystallization can be performed using laser annealing, arc lamps, or strip heaters. Preferably, recrystallization is effected by solid phase epitaxy using a temperature in the range of approximately 600°–650° C.

Figure 3:
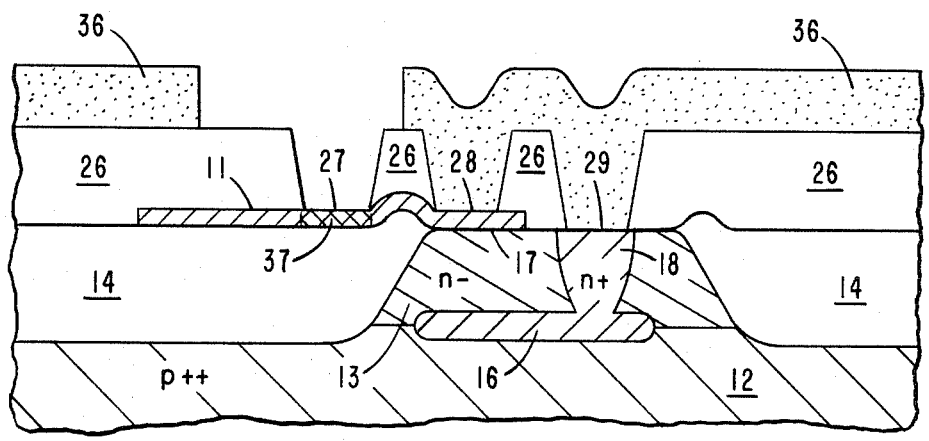
FIG. 3 illustrates the structure of FIG. 2 after a layer of silicon dioxide insulation has been deposited over the structure and after the base contact region deposited in FIG. 2 has been formed.

After the base region 11 is formed, the subsequent regions of the vertical NPN transistor are deposited. Referring now to FIG. 3, a layer 26 of silicon dioxide is deposited by chemical vapor deposition over the entire structure shown in FIG. 2. The silicon dioxide layer 26 is then photomasked by a layer of photoresist (not shown) over the portions of silicon dioxide shown remaining in FIG. 3 and etched to expose a base contact surface 27 and an emitter contact surface 2B on the base 11, and to expose a collector contact surface 29 on the collector sinker 18 of the subcollector 16.

The photoresist (not shown) is then stripped, and a layer of photoresist 36, shown in FIG. 3, is deposited over the entire structure with the exception of the base contact surface 27 and portions of the silicon dioxide 26 adjacent the base contact surface. The base contact 27 is then implanted with additional boron atoms to form a p+ region 37. The photoresist 36 (shown in FIG. 3) is then stripped so that the fabrication is ready to receive a subsequent layer of polysilicon, as is shown in FIG. 4.

Figure 4:
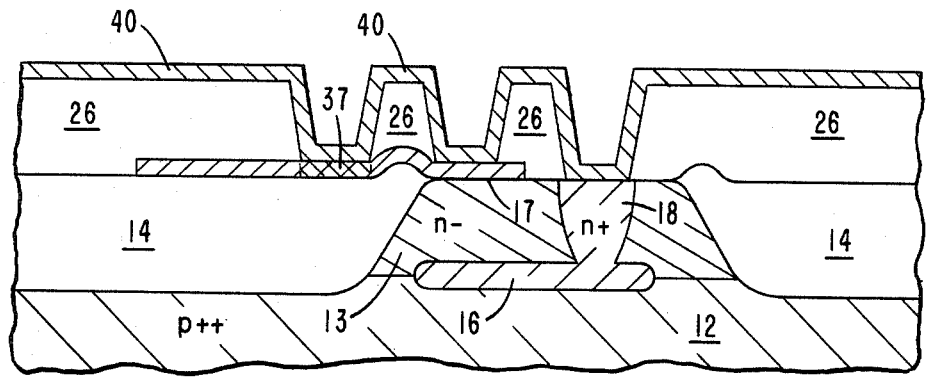
FIG. 4 illustrates a subsequent deposition of n+ polysilicon over the silicon dioxide.

Referring now to FIG. 4, a subsequent, thin layer of polysilicon 40 is deposited by LPCVD at a temperature in the range of 600° C. to 700° C. over the structure of FIG. 3 after the photoresist 36 has been stripped. The polysilicon layer 40 has a thickness in the range of 0.1 to 0.4 um and is in-situ doped with phosphorus or arsenic atoms during the deposition. The density of the phosphorus or arsenic atoms in the polysilicon 40 is approximately $10^{20}$ to $5 \times 10^{21}$ atoms per cubic centimeter. Preferably, phosphorus is used to dope the polysilicon layer 40 because phosphorus has a higher active donor concentration than arsenic and arsenic tends to cluster. Arsenic is more widely used because it tends to form more abrupt junctions due to a lower diffusion coefficient. However, by keeping the deposition temperature low, i.e. 600° C. to 700° C., phosphorus-doped polysilicon can be deposited with an abrupt junction with underlying surfaces and with no need for further diffusion. Consequently, the disadvantages of phosphorus doping are minimized so that the advantages can be utilized.

Figure 5:
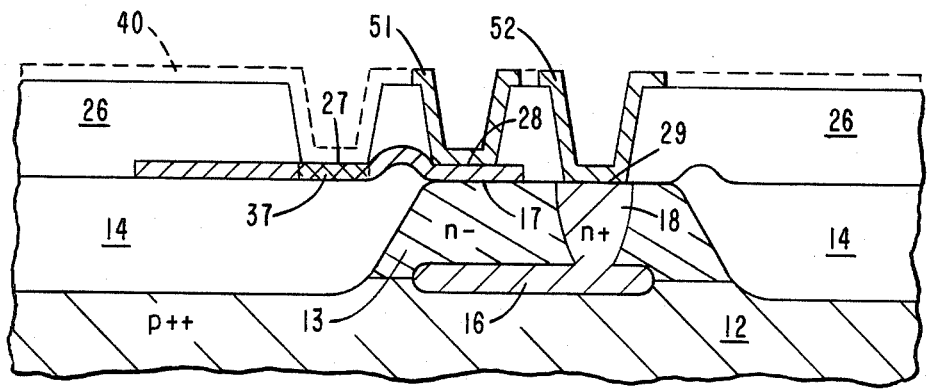
FIG. 5 illustrates the transistor structure after the subsequent layer of polysilicon has been etched to form an emitter and collector contact to prepare the transistor structure for a subsequent metallic deposit, which metallic deposit establishes lead connections with the base contact, the collector contact and the emitter.

Referring now to FIG. 5, the n++ polysilicon 40 of FIG. 4 is photomasked over all areas with the exception of an emitter area 51 and a collector contact area 52. Upon etching the unmasked polysilicon away, only the emitter 51 and collector 52 remain. The surface 27 of the base contact 37 is exposed by the etching. After the photoresist (not shown) used to protect the emitter 51 and collector contact 52 is removed, the base contact, emitter, and collector contact are all exposed for subsequent connections to the circuit in which the transistor is used.

Preferably, the etch to define areas 51 and 52 is performed with potassium-hydroxide, or an EPW (ethylene-diamine, pyrocatechol, water) solution which is a selective etchant for n-type silicon in that it etches p-type silicon about thirty times slower than n-type silicon. Consequently, the etch does not erode the surface 27 of the p+ base contact 37.

Areas 51 and 52 of n-type polysilicon are then thermal-pulsed annealed to increase the concentration of active donors, while simultaneously annealing the p+ implanted base contact region 37. The thermal-pulse anneal preferably takes place in a very short length of time, i.e. less than 10 seconds, and at a temperature less than 1200° C.

Figure 6:
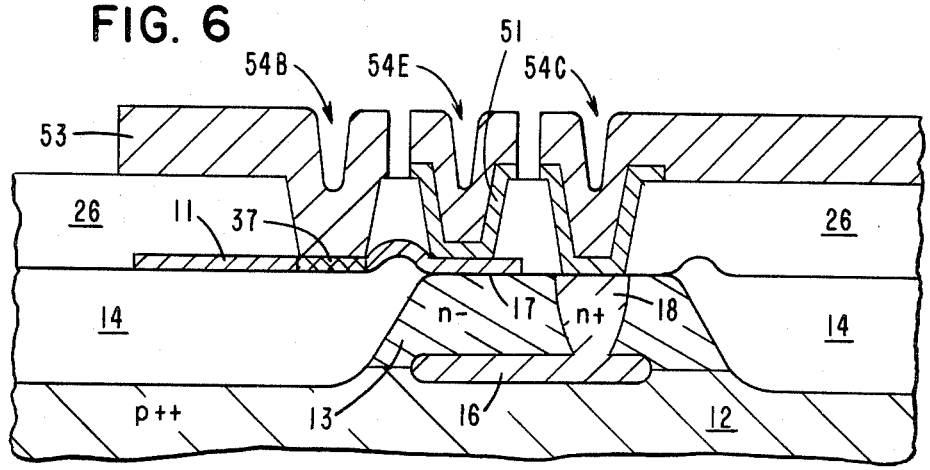
FIG. 6 illustrates the completed structure with metal connections deposited on the structure of FIG. 5.

As is seen in FIG. 6, the procedure for establishing contact with the base contact 37, emitter 51 and collector contact 52 can be the standard procedure wherein metal 53, such as aluminum or aluminum alloy, is deposited on the transistor structure, photomasked and etched to delineate the connections 54B, E, and C, respectively, to the base 37, emitter 51 and collector 52 contacts.

The foregoing description is merely illustrative of the invention which is to be limited only by the following claims.

What is claimed is:

1. In a process for fabrication of an npn bipolar junction transistor wherein the transistor utilizes: p-type polysilicon deposited on a single crystal n-type collector region to form a base region, n+ doped polysilicon deposited on a portion of the base to form an emitter, and n+ doped polysilicon deposited on the collector to form a contact for the collector, the process comprising the steps of:

depositing a layer of polycrystalline or amorphous silicon onto the collector by low-pressure chemical vapor deposition at a temperature in the range of approximately 600° C. to 700° C. while in-situ doping the deposited silicon with boron atoms to lay down the base region;

thermal annealing the base region in an inert environment at temperature high enough to recrystallize the base region into single epitaxial crystal but low enough to avoid migration of dopants from the deposited polycrystalline or amorphous silicon layer into the collector;

forming a p+ base contact region in the base region by implantation of boron ions;

depositing a subsequent layer of polysilicon in contact with the base contact region, the base region and the collector while doping the polysilicon with n+ impurities;

etching the subsequent layer of n+ doped polysilicon with a selective etchant to remove the subsequent layer of polysilicon from the p+ base contact region and to separate the portions thereof in contact with the collector and base regions, so as to form the emitter, to expose the base contact and to form both the emitter and collector contact; and thermal annealing the subsequent layer of polysilicon to increase the number of active donors while simultaneously annealing the p+ base contact region.

2. The process of claim 1 wherein thermal annealing is performed at a temperature range of approximately 700° to 1200° C. for less than ten seconds.

3. The process of claim 2 wherein the silicon layer forming the base region is deposited with a thickness in the range of approximately 0.02 um to 0.5 um and wherein the concentration of boron atoms is in the range of approximately $10^{16}$ to $10^{19}$ boron atoms per cubic centimeter.

4. The process of claim 3 wherein the subsequent layer of n-type polysilicon is deposited with a thickness in the range of approximately 0.1 um to 0.4 um and wherein the doping is in-situ with atoms selected from the group consisting of phosphorus and arsenic to a concentration of approximately $10^{20}$ to $5 \times 10^{21}$ atoms per cubic centimeter.

5. The process of claim 4 wherein the polysilicon forming the subsequent layer is doped with phosphorus.

6. The process of claim 5 wherein the thermal annealing is performed by focusing a pulsed laser beam on the polysilicon layer for a length of time less than ten seconds.

7. The process of claim 2 wherein the thermal annealing is performed by focusing a pulsed laser beam on the polysilicon layers for a length of time less than one second.

8. In a process for fabrication of bipolar junction transistors, wherein the transistor structure upon which the process is being performed initially includes an n-epitaxial collector formed on a heavily doped p++ substrate; the collector having an exposed surface and including an n+ subcollector with an n+ connection to the exposed surface, and the collector being surrounded by a layer of isolating oxide, the process comprising the steps of:

depositing a layer of polycrystalline or amorphous silicon in-situ doped with boron atoms over the exposed surface of the n-type collector, n+ subcollector and over the isolation oxide at a temperature in the range of approximately 600° C. to 700° C.;

photomasking the deposited polycrystalline or amorphous silicon layer over the n-collector and a portion of the isolation oxide;

etching the deposited polycrystalline or amorphous silicon layer to reexpose the n+ sinker to the n+ subcollector and then stripping the photomask to expose the remainder of the deposited layer of silicon;

recrystallizing the remaining polycrystalline or amorphous silicon layer in an inert environment by thermal annealing the silicon at a temperature low enough to avoid diffusion of dopants from the deposited silicon into the collector but high enough to recrystallize the deposited silicon to form a single crystal base region for the transistor whereby the base region has an abrupt junction with the collector;

depositing a layer of silicon dioxide over the transistor structure;

exposing first and second portions of base region and surface of the n+ layer for subsequent contact by photomasking and etching the silicon dioxide;

photomasking the n+ layer and the first exposed portion of the base region;

implanting the second portion of the base region with boron ions to form a p+ base contact region therethrough and stripping the photoresist to reexpose the first exposed portion of the base region and the n+ layer;

depositing a subsequent layer of polysilicon doped with metal atoms selected from the group consisting of phosphorus or arsenic over the transistor structure at a deposition temperature in the range of approximately 600° C. to 700° C.;

thermal annealing the subsequent layer of polysilicon to increase the concentration of active donors in the subsequent layer of polysilicon, to thereby form an emitter region in contact with the first portion of the base region and a collector contact region in contact with the n+ layer, while annealing the p+ base contact region formed through the second portion of the base region, whereby the p+ base contact region is electrically activated and the emitter region is electrically activated while maintaining an abrupt connection with the first portion of the base region, and photomasking and etching the subsequent layer of polysilicon away from all regions with the exception of the collector contact region and the emitter region, which are subsequently contacted by separate metallic connections.

* * * * *